United States Patent
Krinke

(10) Patent No.: US 6,944,936 B2
(45) Date of Patent: Sep. 20, 2005

(54) METHOD FOR MANUFACTURING AN INTEGRATED LEAD SUSPENSION

(75) Inventor: Todd A. Krinke, Rockford, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 10/264,635

(22) Filed: Oct. 4, 2002

(65) Prior Publication Data

US 2003/0029026 A1 Feb. 13, 2003

Related U.S. Application Data

(62) Division of application No. 09/397,448, filed on Sep. 17, 1999, now Pat. No. 6,483,669.

(51) Int. Cl.7 .......................... G11B 5/127; H04R 31/00
(52) U.S. Cl. ............................. 29/603.04; 29/603.05; 29/603.07; 29/603.12; 29/603.13; 29/603.14; 29/854; 360/244.1; 360/244.2; 360/244.3; 360/244.8; 360/245.8; 360/245.9
(58) Field of Search ............ 29/603.07, 603.12–603.14, 29/854, 603.04, 603.5; 360/244.1–244, 244.8, 245.8, 245, 244.9, 245.9

(56) References Cited

U.S. PATENT DOCUMENTS

| | | | | |
|---|---|---|---|---|
| 5,055,969 A | * | 10/1991 | Putnam | 361/749 |
| 5,615,477 A | | 4/1997 | Sweitzer | 29/840 |
| 5,781,380 A | * | 7/1998 | Berding et al. | 360/264.2 |
| 5,844,751 A | | 12/1998 | Bennin et al. | 350/104 |
| 5,864,445 A | | 1/1999 | Bennin et al. | 360/104 |
| 6,014,289 A | | 1/2000 | Goss | 360/104 |
| 6,266,213 B1 | | 7/2001 | Hiraoka | 360/244.1 |
| 6,282,062 B1 | | 8/2001 | Shiraishi | 360/244.1 |
| 6,437,944 B2 | * | 8/2002 | Ohwe et al. | 360/244.1 |
| 6,483,669 B1 | | 11/2002 | Krinke | 360/244.1 |

FOREIGN PATENT DOCUMENTS

| | | | |
|---|---|---|---|
| EP | 0902427 | 3/1999 | |
| EP | 0911812 | 4/1999 | |
| JP | 62-217476 | 9/1987 | |
| JP | 63-292412 | 11/1988 | |
| JP | 3-25717 | 4/1991 | |
| JP | 03187295 | 8/1991 | |
| JP | 10247310 A | * 9/1998 | G11B/5/60 |
| JP | 3-272015 | 3/1999 | |

OTHER PUBLICATIONS

"Chip on suspension MR head"; Shiraishi, M.; IEMT/IMC Symposium, 2nd 1998, Apr. 15–17, 1998 pp.: 333–336.*

* cited by examiner

Primary Examiner—Paul D Kim
(74) Attorney, Agent, or Firm—Faegre & Benson LLP

(57) ABSTRACT

A method for manufacturing an integrated lead suspension or component having an integrated circuit (IC) with an array of terminals. The suspension or component is formed from a laminated sheet of material including a spring metal layer and a conductive material layer separated by an insulating layer. The method includes forming an IC window in the spring metal layer, forming integrated conductive leads in the conductive material layer and forming holes in the insulating layer. The IC can then be mounted to the suspension or component in the IC window, and the array of terminals electrically interconnected to the integrated conductive leads through the insulating layer.

5 Claims, 10 Drawing Sheets

METHOD FOR MANUFACTURING AN INTEGRATED LEAD SUSPENSION

REFERENCE TO RELATED APPLICATION

This application is a division of application Ser. No. 09/397,448, filed on Sep. 17, 1999 now U.S. Pat. No. 6,483,669, and entitled "Integrated Lead Suspension With IC Chip And Method Of Manufacture."

FIELD OF THE INVENTION

The present invention relates generally to integrated lead head suspensions for magnetic disk drives. In particular, the invention is an integrated lead suspension or component having an integrated circuit (IC) chip mounted thereon, and a method for manufacturing the suspension or component.

BACKGROUND OF THE INVENTION

Integrated lead or so-called "wireless" suspensions and flexures for supporting read and/or write heads over the rotating recording media in magnetic disk drives are generally known and disclosed, for example, in the Bennin et al. U.S. Pat. Nos. 5,844,751 and 5,864,445. Suspensions and flexures of these types include conductive leads or traces which are formed integrally on the stainless steel or other spring material layer of the device. A layer of insulating material such as polyimide separates the conductive leads from the stainless steel layer. The integrated lead suspensions and flexures described in the Bennin et al. patents referred to above are manufactured from laminated sheets of material using "subtractive" processes. During these processes, portions of the individual layers of the laminated sheet which are to form the load beam, insulators, leads or other suspension and flexure features are protectively masked, and the sheet exposed to chemical, plasma, or other etchants to remove the undesired and unmasked portions. Another known approach for manufacturing integrated lead suspensions involves additive processes. During additive manufacturing methods the insulating and conductive lead layers are sequentially deposited onto or built up on the stainless steel base layer.

Preamplifier or other integrated circuit (IC) chips are sometimes mounted on integrated lead suspensions, typically either on the rigid region of the load beam or on a chip supporting extension off the side of the suspension mounting region. IC chips configured as conventional flip chips are often used in these applications due to their relatively low height profile (approximately 12 mils thick). However, the IC chip mounting regions on the suspensions often require formed offsets to provide sufficient clearance between even these relatively thin ICs and the spinning disk media or adjacent suspensions. As a result of their non-planarity, offset forms of these types can increase the difficulty of positioning and welding the flexures to the suspension load beams.

The ICs are mounted to the surfaces of the suspensions having the conductive leads by soldering the IC electrical terminals to bond pads in the conductive leads. Solder masks are typically formed over the conductive lead bond pads to prevent solder from spreading between and electrically shorting the leads during the mounting process. Patterned layers of photoimageable material (a coverlay) formed over the bond pads have been used as solder masks. However, this approach has presented a number of problems. The coverlay occasionally lifts away from the conductive leads during the soldering process (solder reflow), thereby allowing the solder to wick under the coverlay and short adjacent leads. During the developing process coverlay residue can form in the holes and prevent good electrical solder contact between the conductive lead bond pads and the IC chip terminals. Conductive adhesive is used to electrically interconnect one of the IC leads to the stainless steel suspension for grounding purposes, necessitating an additional process step and the use of adhesive dispensing equipment.

It is evident that there is a need for improved structures and methods for mounting IC chips to integrated lead suspensions. In particular, there is a need for structures and methods that minimize the height profile of integrated lead suspensions with ICs. Methods which can achieve these features without the need for additional processing steps or materials (e.g., conductive adhesive) beyond those used to manufacture the integrated lead suspension itself would be desirable. To be commercially viable, the structure and method must be capable of enabling the ICs to be efficiently mounted to the suspension with high-quality electrical connections.

SUMMARY OF THE INVENTION

The present invention is an improved integrated lead suspension or component (e.g., a flexure) adapted for having an integrated circuit (IC) chip with an array of terminals mounted thereto. One embodiment of the suspension or suspension component includes a spring metal layer, integrated conductive leads extending along the spring metal layer, and an insulating layer between the conductive leads and the spring metal layer. The spring metal layer has an IC window for receiving an array of terminals of an IC chip. The conductive leads include an array of bond pads in the IC window positioned for electrical interconnection to an array of terminals of an IC chip. The insulating layer extends across at least portions of the IC window and includes an array of holes adjacent to the array of conductive lead bond pads to enable an array of terminals of an IC chip to be electrically interconnected to the array of bond pads. The IC window and array of bond pads can be at a location corresponding to the mounting region of a suspension or the rigid region of the suspension.

DETAILED DESCRIPTION OF THE PREFERRED EMBODIMENTS

Figure 1:
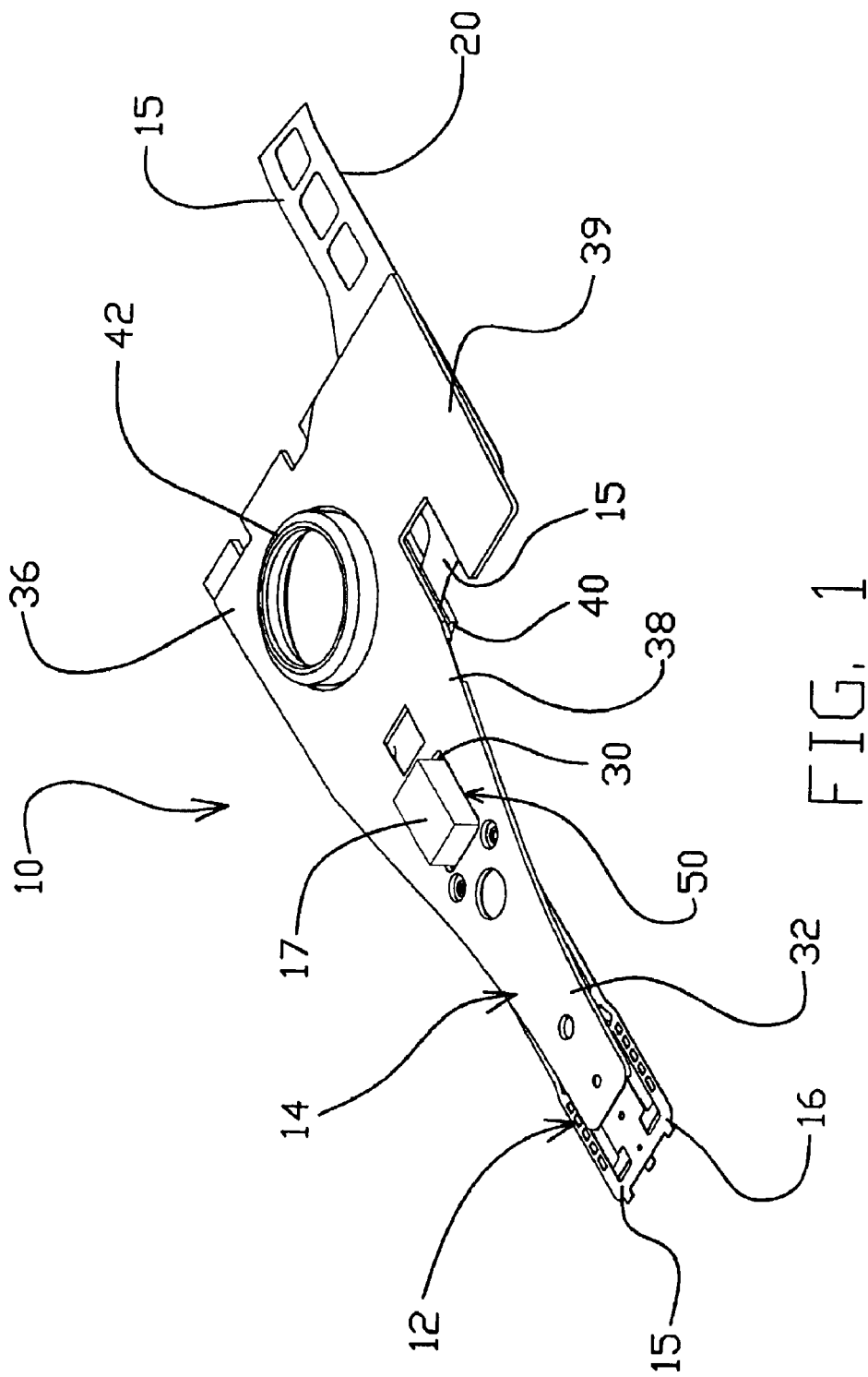
FIG. 1 is an isometric view of a first embodiment of a suspension having an integrated lead flexure in accordance with the present invention. The flexure has an integrated circuit (IC) chip mounted in the rigid region of the load beam on the stainless steel side of the suspension. The stainless steel side of the flexure is shown in FIG. 1.
Figure 2:
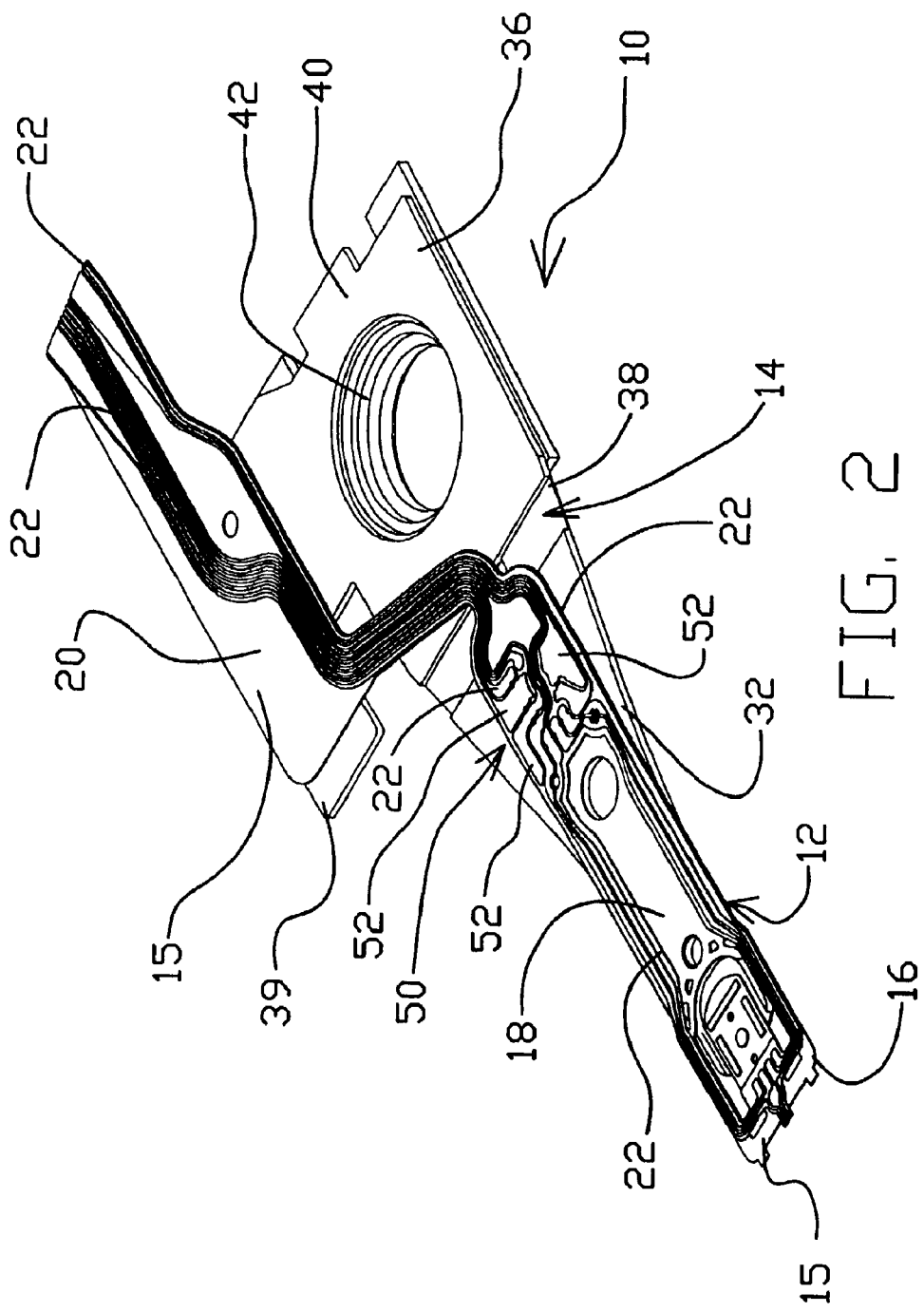
FIG. 2 is an isometric view of the suspension shown in FIG. 1, showing the integrated lead flexure on the side of the suspension opposite the side shown in FIG. 1.
Figure 3:
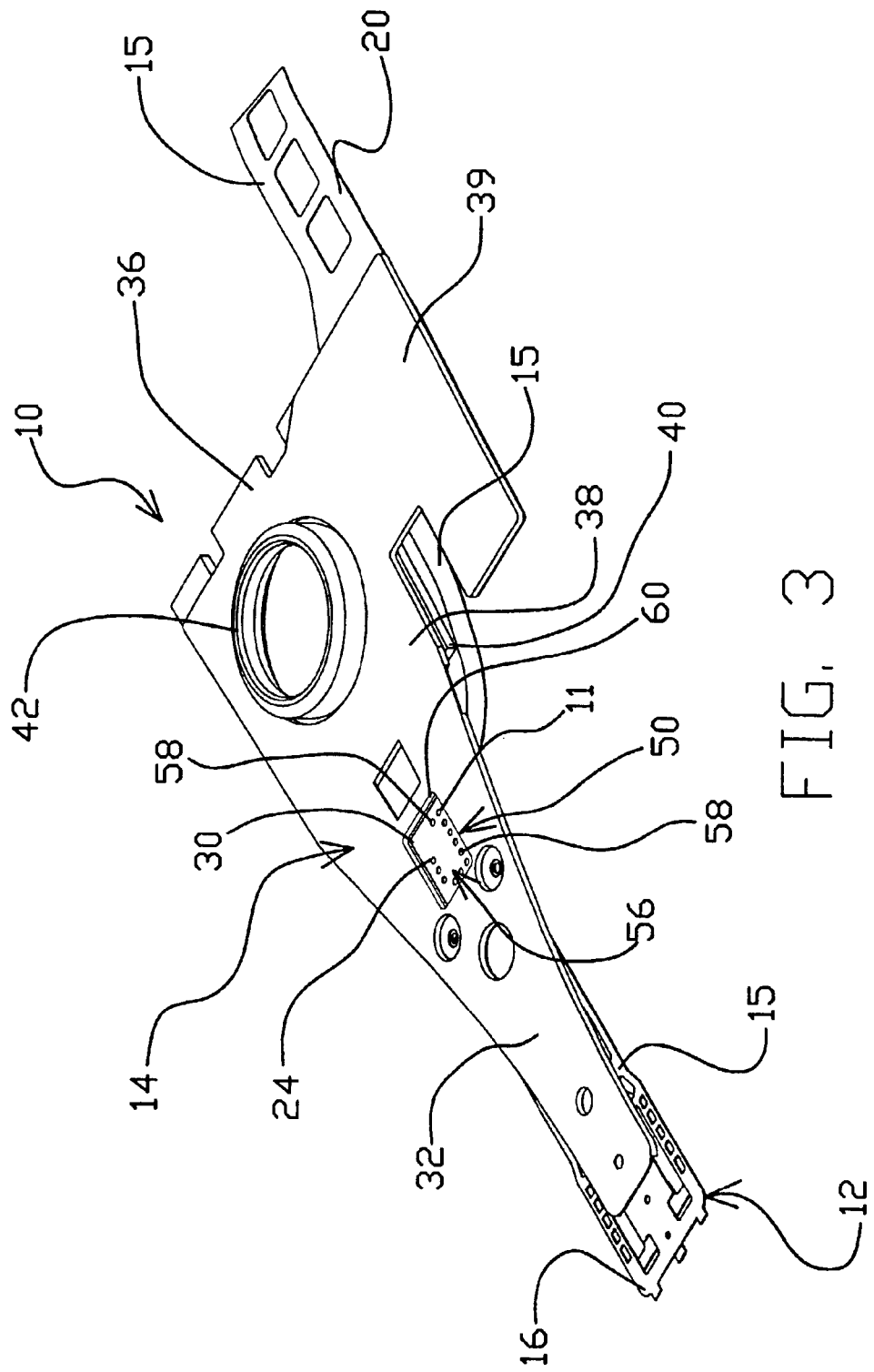
FIG. 3 is an isometric view of the suspension shown in FIG. 1, showing the same side of the suspension as shown in FIG. 1, without the IC chip mounted to the suspension.

Integrated lead suspension 10, a first embodiment of the present invention, can be described generally with reference to FIGS. 1–4. As shown, suspension 10 includes an integrated lead flexure 12 (i.e., a suspension component) which is welded or otherwise mounted to a stainless steel load beam 14. In the illustrated embodiment, flexure 12 is formed from a laminated sheet of material which includes an insulating layer 11 (e.g., polyimide) between a conductor layer 13 (e.g., copper) and a stainless steel (e.g., spring material) layer 15. With the exception of the chip mounting region 50 which is described in greater detail below, flexure 12 can be conventional in design and structure and includes a flexure region 16, mounting region 18 and tail 20. A plurality of traces or leads 22 are formed from the conductor layer 13 and extend from the flexure region 16 across the mounting region 18 and along the tail 20. Insulating regions 24 are formed from the insulating layer of the laminated sheet and are located between and electrically isolate the leads 22 from the adjacent portions of the stainless steel layer 15.

With the exception of the chip mounting window 30, the load beam 14 can be conventional in design and structure. In the illustrated embodiment the load beam 14 includes a rigid region 32, a mounting region 36 and a spring region 38 between the mounting and rigid regions. Mounting region 36 has a tail support portion 39 on one side of the load beam 14. A conventional base plate 40 having a boss tower 42 which extends through a hole in the mounting region 36 is welded or otherwise attached to the mounting region of the load beam 14. The chip mounting window 30 extends through the rigid region 32 of the load beam. The mounting region 18 of flexure 12 is welded or otherwise attached to the load beam 14 with its chip mounting region 50 adjacent to the chip mounting window 30. The tail 20 of the flexure 12 is similarly attached to the tail support portion 39 on the mounting region 38 of load beam 14. As shown, the flexure 12 is attached to the load beam 14 with the leads 22 and insulating region 24 opposite the stainless steel layer 15 of the flexure from the load beam. In other words, the stainless steel layer 15 of the flexure 12 is mounted directly to the load beam 14.

Figure 4:
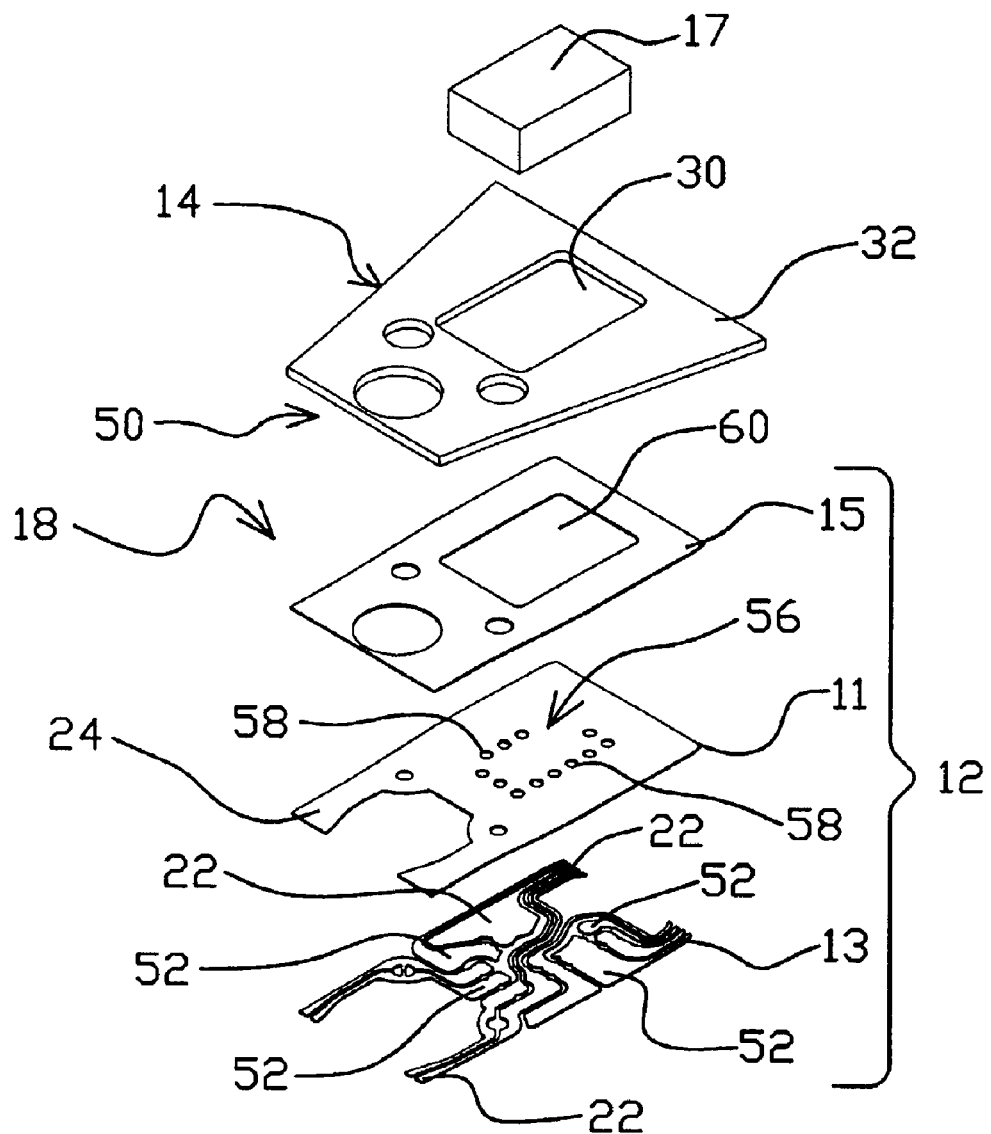
FIG. 4 is a detailed exploded view of the IC mounting region of the suspension shown in FIG. 1.
Figure 5:
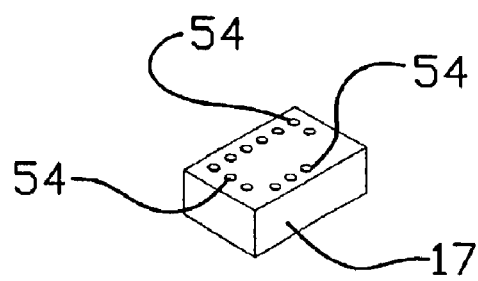
FIG. 5 is an isometric view of the bottom side of the IC (i.e., the side opposite that shown in FIG. 1) illustrating the array of terminals.
Figure 6:
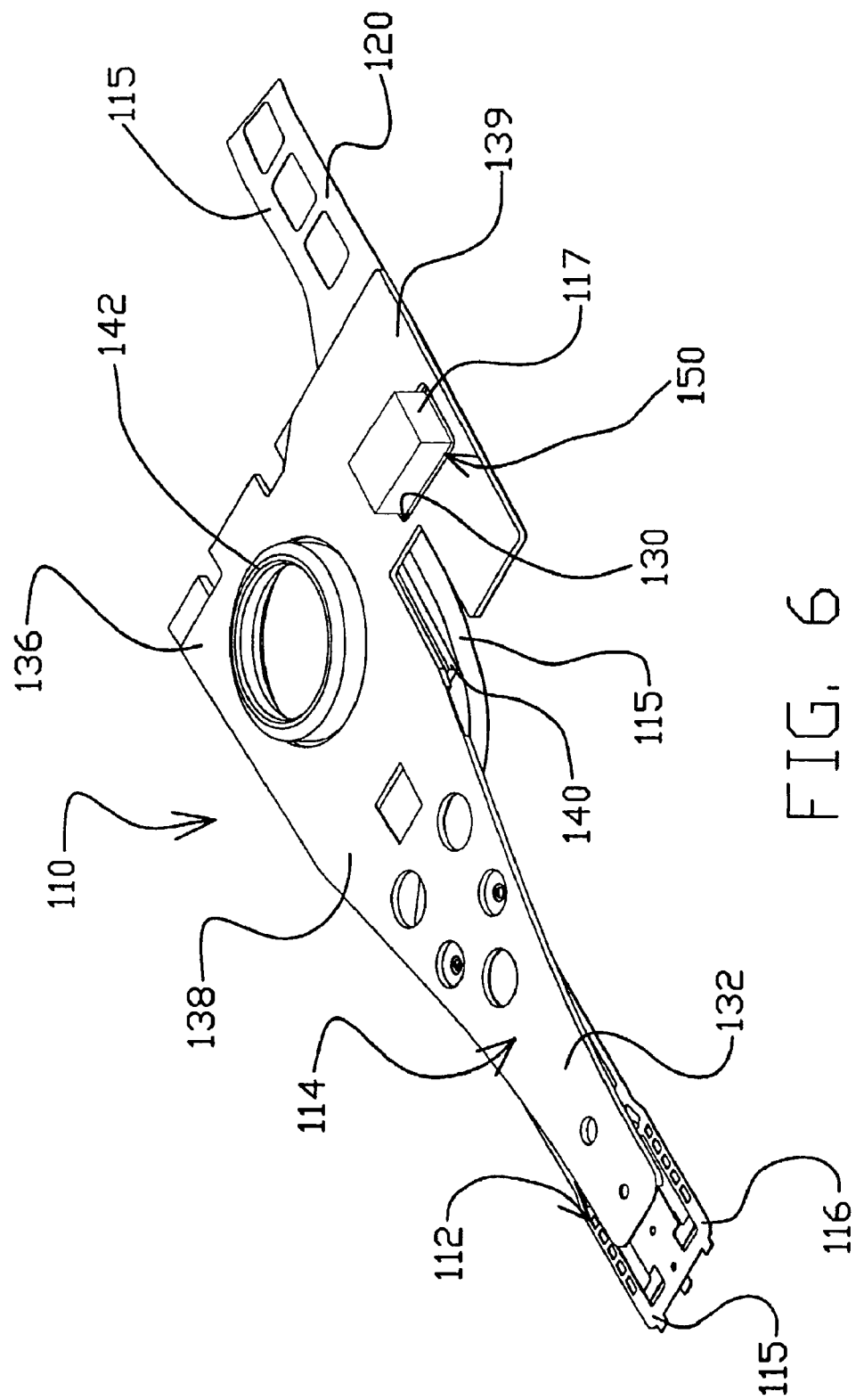
FIG. 6 is isometric view of a second embodiment of a suspension having an integrated lead flexure in accordance with the present invention, having an integrated circuit (IC) chip mounting region on an extension of the mounting region of the suspension. The stainless steel side of the suspension is shown in FIG. 6.
Figure 7:
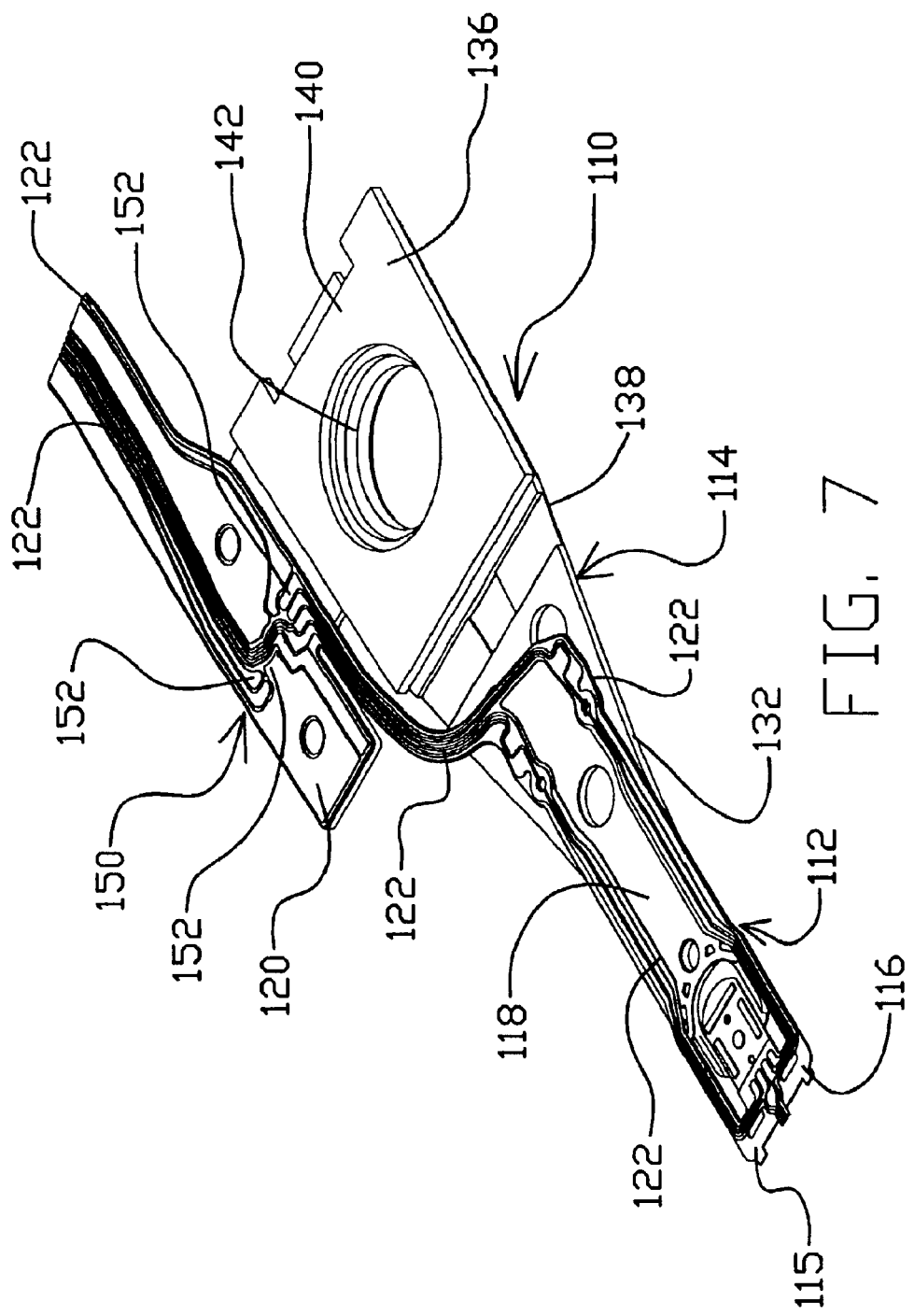
FIG. 7 is an isometric view of the suspension shown in FIG. 6, showing the integrated lead flexure on the side of the suspension opposite the side shown in FIG. 6.
Figure 8:
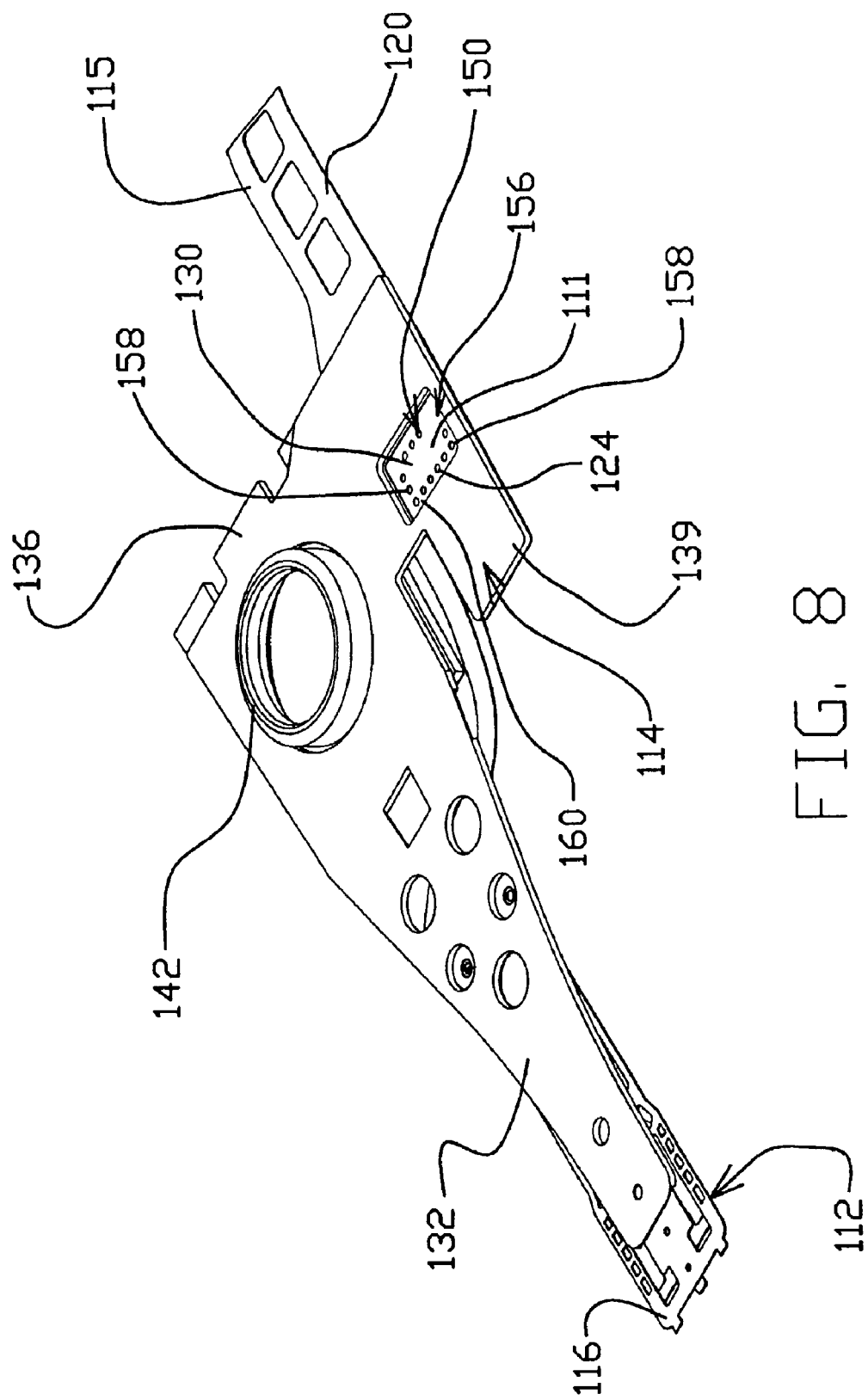
FIG. 8 is an isometric view of the suspension shown in FIG. 6, and taken from the same side of the suspension as shown in FIG. 6, without the IC chip mounted to the suspension.
Figure 9:
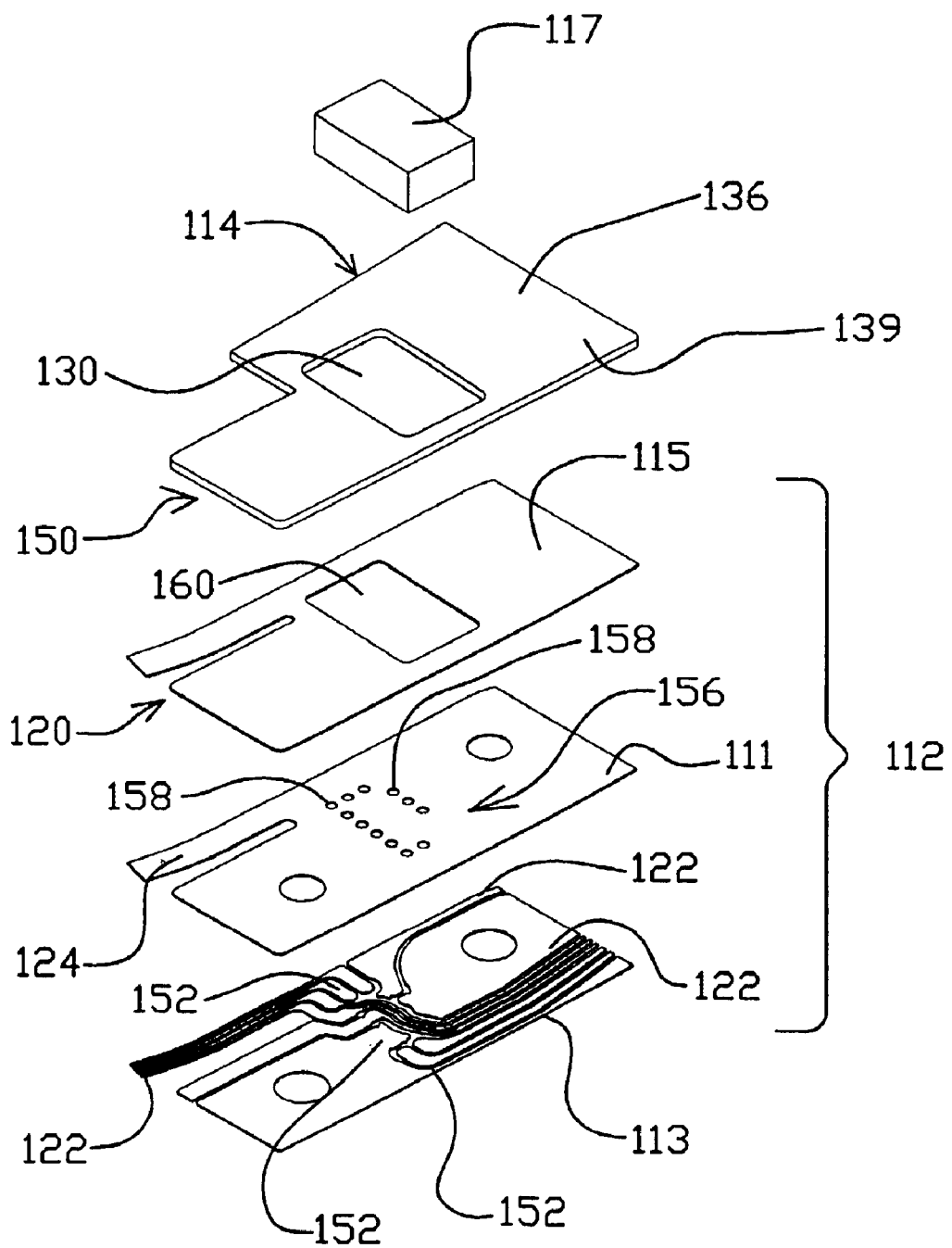
FIG. 9 is a detailed exploded view of the IC mounting region of the suspension shown in FIG. 6.

The chip mounting region 50 of flexure 12 can be described in greater detail with reference to FIG. 4. As shown, an array of bond pads 52 are formed in the leads 22 at the chip mounting region 50. The bond pads 52 are enlarged portions of the leads 22, and are positioned and arranged in a pattern or footprint which corresponds in a mating relationship to the pattern of the array of terminals 54 on the IC 17 (shown in FIG. 5). In a preferred embodiment, IC 17 is a flip chip type device having terminals 54 which include solder balls. Flip chip ICs of this type are well known and commercially available. A solder mask 56 is formed in the insulating region 24 at the chip mounting region 50. As shown, the solder mask 56 includes an array of holes 58. Holes 58 are located above the bond pads 52, and are positioned and arranged in a pattern or footprint which corresponds in a mating relationship to the pattern of the array of terminals 54 on the IC 17. The holes 58 are smaller than the bond pads 52 so the outer radius of the bond pads are adhered to the insulating layer 11. Although shown circular in shape, holes 58 can take other shapes that allow solder to reflow and interconnect the terminals 54 of IC 17 to the bond pads 52. The dielectric solder mask 56 also serves as a structural member which holds together the array of bond pads 52 when the IC chip 17 is mounted to the chip mounting region 50. Chip mounting region 50 also includes a window 60 through the stainless steel layer 15 of the flexure 12, adjacent to the solder mask 56. Bond pads 52, solder mask 56 and window 60 can be formed on the flexure 12 at the same time, using the same conventional and generally known processes used to form the other features of the flexure in the respective conductive layer 13, insulating layer 11 and stainless steel layer 15 of the laminated sheet of material.

IC 17 is mounted to the chip mounting region 50 of suspension 10 through the window 30 in load beam 14. In particular, IC 17 is mounted to the suspension 10 with its array or terminals 54 extending through the window 30 in the load beam 14 and the window 60 in the flexure 12, and positioned adjacent to the array of holes 58 in solder mask 56. Using conventional solder reflow procedures, the solder balls (not separately shown) on the terminals 54 of IC 17 flow into the solder mask holes 58 to electrically interconnect the array of IC terminals 54 to the array of bond pads 52. IC 17 is also mechanically interconnected to the suspension 10 by this soldering procedure. In other words, IC terminals 54 extend through the holes 58 in solder mask 56 into electrical and mechanical communication with bond pads 52. Ultrasonic direct lead gold bond techniques can also be used to bond the IC 17 to the array of bond pads 52.

Integrated lead suspension 110, a second embodiment of the present invention, is shown in FIGS. 6–9. Suspension 110 is similar in many respects to suspension 10 described above, and similar features are indicated by similar reference numbers. As shown, the chip mounting window 130 through load beam 114 is located in the flexure tail support portion 139 of the mounting region 136. Accordingly, the chip mounting region 150 of flexure 112 is located on the portion of the tail 120 which is configured to be mounted to the tail support portion 139 of the load beam 114. Other than these differences in the locations of load beam window 130 and chip mounting region 150, flexure 112 and load beam 114, and in particular the chip mounting window 130 of the load beam and the chip mounting region 150 of the flexure, can be structurally the same and manufactured in the same manner as the chip mounting window 30 and chip mounting region 50 of suspension 10 described above.

Figure 10:
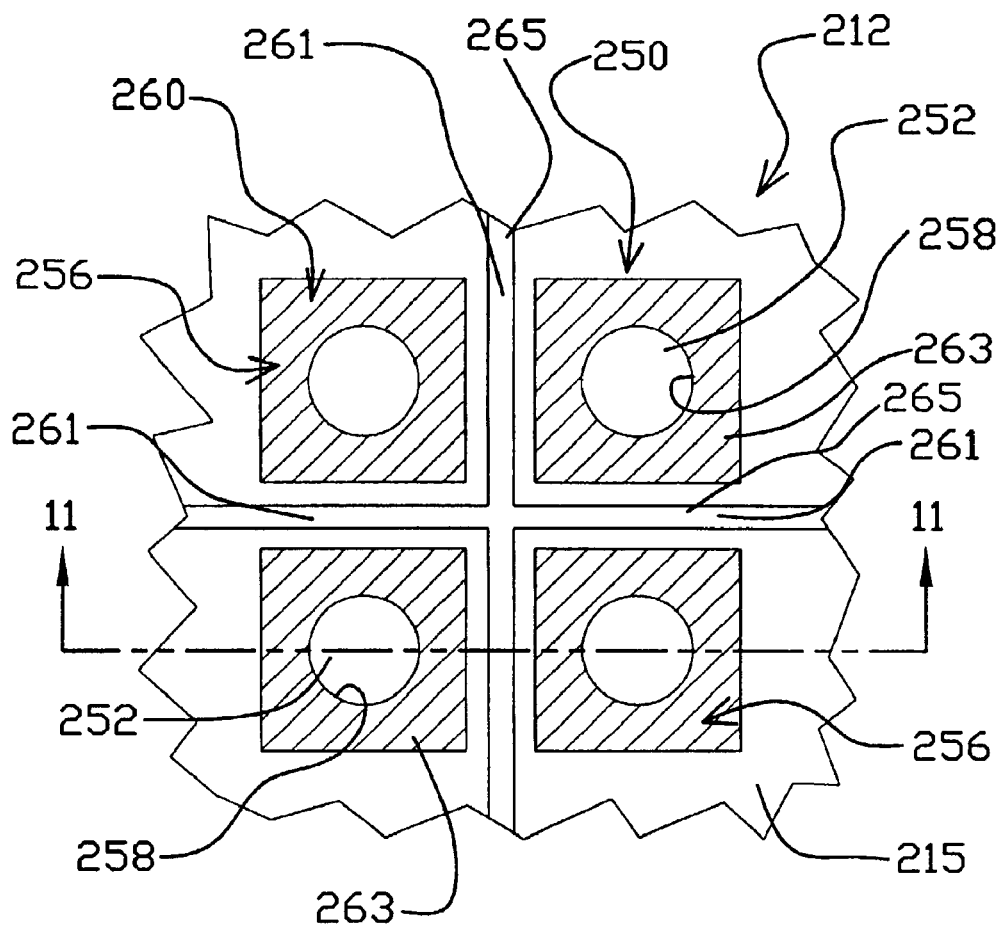
FIG. 10 is a detailed top view of a first alternative chip mounting region which can be incorporated into the suspensions in accordance with the present invention.
Figure 11:
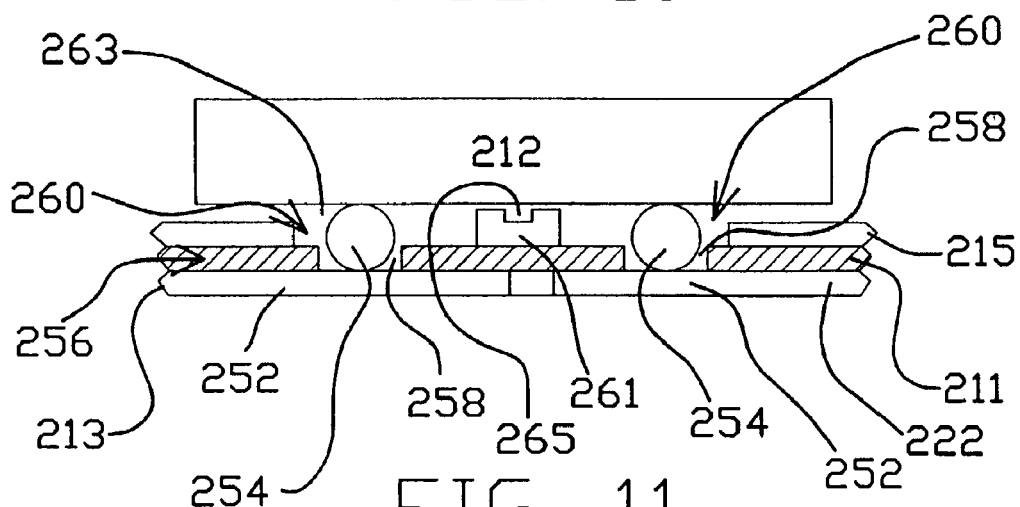
FIG. 11 is a sectional view of the chip mounting region shown in FIG. 10, and taken along line 11—11.

FIGS. 10 and 11 illustrate an alternative chip mounting region 250 which can be incorporated into the flexures 12 and 112 of the suspensions 10 and 110, respectively, described above. Chip mounting region 250 is similar to chip mounting regions 50 and 150 described above, and similar features are indicated by similar reference numerals. As shown, the window 260 through the stainless steel layer 215 of the flexure 212 includes stiffening members 261 which extend across the window and divide the window into a number (four are shown for purposes of example) of individual sections 263. Stiffening members 261 enhance the stiffness of the chip mounting region 250. IC chip 217 can thereby be mounted to the flexure 212 with increased efficiency. Stiffening members 261 can also be effectively used as a spacer to automatically level IC chip 217 during the solder reflow process. When the solder bumps on the terminals 254 of the IC chip 217 collapse during the reflow, the chip 217 will rest on top of the stiffening members 261. Grooves or channels 265 can be etched or otherwise formed in the stiffening members 261 to aid in the epoxy underfill process by which the epoxy is applied between the IC 217 and stainless steel layer 215 after the terminals 254 of IC 217 is soldered to the bond pads 252.

Figure 12:
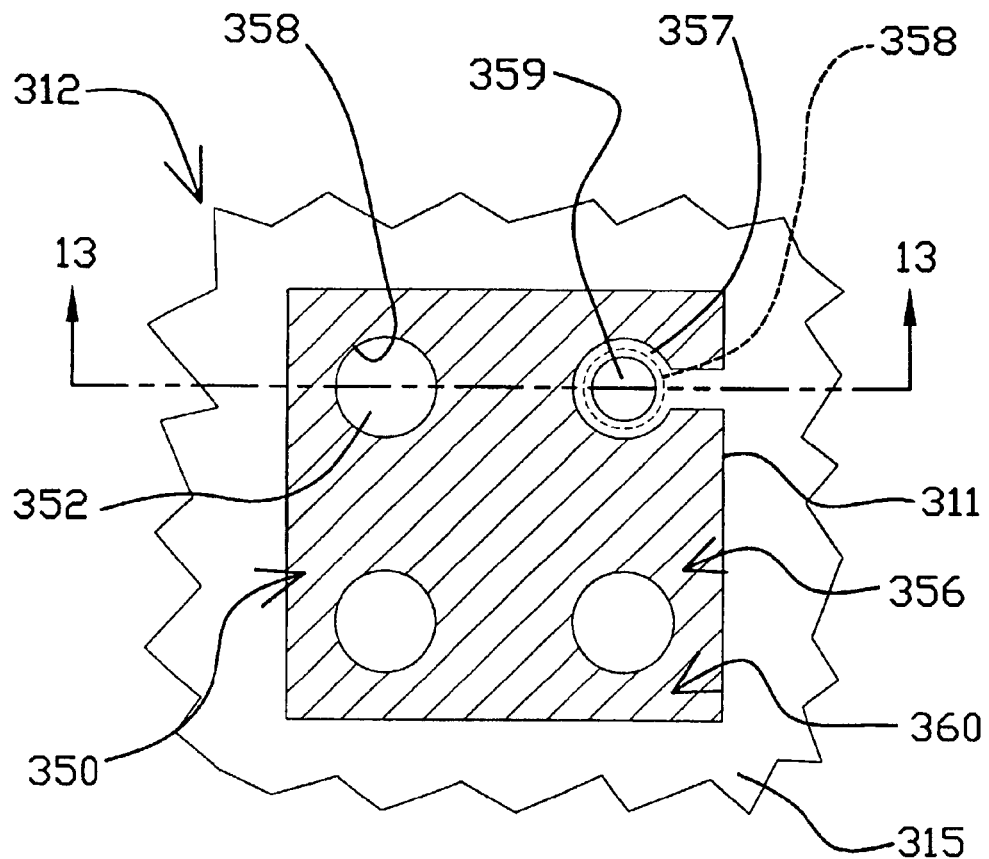
FIG. 12 is a detailed top view of a second alternative chip mounting region which can be incorporated into the suspensions in accordance with the present invention.
Figure 13:
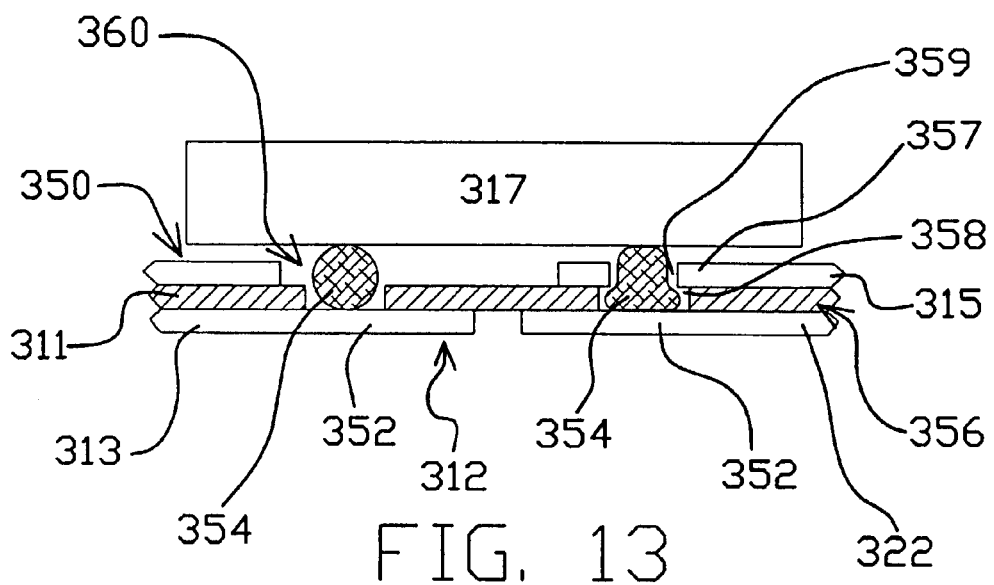
FIG. 13 is a sectional view of the chip mounting region shown in FIG. 12 and taken along line 13—13.

FIGS. 12 and 13 illustrate another alternative chip mounting region 350 which can be incorporated into the flexures 12 and 212 of the suspensions 10 and 110, respectively, described above. Features of chip mounting region 350 can also be incorporated into the chip mounting region 250 described above. Chip mounting region 350 is similar to chip mounting regions 50 and 150 described above, and similar features are indicated by similar reference numerals. As shown, the chip mounting region 350 includes a ground tab 357 which extends into the window 360 in the stainless steel layer 315 of the flexure 312. The ground tab 357 is an extension or peninsula of the stainless steel layer 315 of the flexure 312, and extends to a location over one of the holes 358 in the solder mask 356. A hole 359 in the ground tab 357 is registered with the solder mask hole 358 over which the ground tab 357 extends. In the embodiment shown, the hole 359 in the ground tab 357 has a diameter which is smaller than the diameter of the solder mask hole 358. When the IC chip 317 is mounted to the chip mounting region 350 by solder reflow processes, the solder ball of the terminal 354 which extends through the hole 359 of the ground tab 357 will wick between the ground tab 357 and the associated integrated lead bond pad 352, thereby electrically connecting the bond pad to the stainless steel layer 315 of the flexure 312. Ground tab 357 will generally be located at a position corresponding to a bond pad 352 and terminal 354 of the IC chip to be grounded. Although only one ground tab 357 is shown in FIGS. 12 and 13, more than one such ground tab could be incorporated into the suspension as needed.

The IC mounting region of the present invention offers a number of important advantages. Since the IC chip is mounted in a window on the stainless steel side of the suspension or flexure, the overall height of the assembled component, and therefore the clearance it requires in a drive, are reduced. The invention thereby provides enhanced space utilization and efficiency of manufacture. No mechanical offset forming in the suspension layers is required to achieve this advantage. Problems associated with the use of a photoimageable coverlay as a solder mask (e.g., lifting of the coverlay, solder wicking underneath the coverlay and coverlay residue impeding good quality contact with the bond pads) are reduced by using the insulating layer as a solder mask. No additional materials are needed, and the mounting region components can be formed during current manufacturing steps. In short, no additional manufacturing operations are needed.

Although the present invention has been described with reference to preferred embodiments, those skilled in the art will recognize that changes can be made in form and detail without departing from the spirit and scope of the invention. In particular, although described in connection with a subtractive manufacturing process, the structure can be produced by additive-type integrated lead manufacturing processes as well. Furthermore, the IC mounting region can be formed directly on the load beam rather than on the flexure (component) as in the illustrated embodiment.

What is claimed is:

1. A method for manufacturing an integrated lead suspension or component adapted for having an integrated circuit (IC) with an array of terminals mounted thereto from a laminated sheet of material including a spring metal layer and a conductive material layer separated by an insulating layer, including:

forming an IC window in the spring metal layer, the IC window adapted for receiving an array of terminals of an IC;

forming integrated conductive leads having an array of bond pads in the conductive material layer, the bond pads positioned adjacent to the IC window for electrical interconnection to an array of terminals of an IC; and forming an array of holes extending through the insulating layer between the IC window and the conductive leads adjacent to the array of conductive lead bond pads, to enable an array of terminals of an IC to be electrically interconnected to the array of bond pads through the insulating layer.

2. The method of claim 1 wherein forming the IC window includes forming a plurality of openings in the spring metal layer and forming stiffener members between the openings.

3. The method of claim 1 and further including forming a grounding tab in the spring metal layer, the grounding tab extending into the IC window adjacent to one of the bond pads and having a hole aligned with one of the holes in the insulating layer.

4. The method of claim 1 and further including:

placing the IC having an array of leads in the IC window with the leads extending through the array of holes in the insulating layer; and soldering the array of leads of the IC to the array of bond pads in the conductive metal layer.

5. The method of claim 1 for manufacturing an integrated lead flexure having an IC window in the spring metal layer, and further including:

manufacturing a load beam having an IC window;

positioning the load beam with respect to the flexure so the IC window of the load beam is adjacent to the IC window of the flexure; and mounting the spring metal layer of the flexure to the load beam.

* * * * *